(12) United States Patent
Park et al.

(45) Date of Patent: Feb. 3, 2009

(10) Patent No.: US 7,485,585 B2

(54) METHOD OF FORMING A THIN FILM, METHOD OF MANUFACTURING A GATE STRUCTURE USING THE SAME AND METHOD OF MANUFACTURING A CAPACITOR USING THE SAME

(75) Inventors: Young-Geun Park, Suwon-si (KR); Jae-Hyun Yeo, Bucheon-si (KR); Eun-Ae Chung, Suwon-si (KR); Ki-Vin Im, Suwon-si (KR); Young-Sun Kim, Suwon-si (KR); Sung-Tae Kim, Seoul (KR); Cha-Young Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 348 days.

(21) Appl. No.: 11/372,117

(22) Filed: Mar. 10, 2006

(65) Prior Publication Data

US 2006/0205198 A1  Sep. 14, 2006

(30) Foreign Application Priority Data

Mar. 11, 2005   (KR) ...................... 10-2005-0020358

(51) Int. Cl.
*H01L 21/469* (2006.01)
*H01L 23/58* (2006.01)

(52) U.S. Cl. ...................................... 438/781; 257/642
(58) Field of Classification Search ................. 438/623, 438/765, 780–781; 257/642–644
See application file for complete search history.

(56) References Cited

U.S. PATENT DOCUMENTS

| | | | |
|---|---|---|---|
| 6,524,967 B1 | 2/2003 | Alluri | |
| 7,094,712 B2 * | 8/2006 | Im et al. | ...................... 438/785 |
| 2004/0033698 A1 | 2/2004 | Lee et al. | |
| 2006/0062917 A1 * | 3/2006 | Muthukrishnan et al. | 427/248.1 |

FOREIGN PATENT DOCUMENTS

KR   10-2004-0041944   5/2004

* cited by examiner

*Primary Examiner*—Calvin Lee
(74) *Attorney, Agent, or Firm*—Harness, Dickey & Pierce, P.L.C.

(57) ABSTRACT

In a method of forming a thin film and methods of manufacturing a gate structure and a capacitor, a hafnium precursor including one alkoxy group and three amino groups, and an oxidizing agent are provided on a substrate. The hafnium precursor is reacted with the oxidizing agent to form the thin film including hafnium oxide on the substrate. The hafnium precursor may be employed for forming a gate insulation layer of a transistor or a dielectric layer of a capacitor.

17 Claims, 12 Drawing Sheets

METHOD OF FORMING A THIN FILM, METHOD OF MANUFACTURING A GATE STRUCTURE USING THE SAME AND METHOD OF MANUFACTURING A CAPACITOR USING THE SAME

PRIORITY STATEMENT

This application claims priority under 35 USC § 119 to Korean Patent Application No. 2005-20358 filed on Mar. 11, 2005, the contents of which are herein incorporated by reference in their entirety.

BACKGROUND OF THE INVENTION

1. Field of the Invention

Example embodiments of the present invention relate to a method of forming a thin film, a method of manufacturing a gate structure using the same and a method of manufacturing a capacitor using the same. More particularly, example embodiments of the present invention relate to a method of forming a thin film including hafnium oxide, a method of manufacturing a gate structure using the same and a method of manufacturing a capacitor using the same.

2. Description of the Related Art

A thin film of a semiconductor device has been recently formed using a material having a high dielectric constant. For example, a gate insulation layer of a metal oxide semiconductor (MOS) transistor, a dielectric layer of a capacitor, or a dielectric layer of a flash memory device may be formed using a material having a high dielectric constant. When a thin film is formed using a material having a high dielectric constant, the thin film may have a thin equivalent oxide thickness (EOT). Additionally, a leakage current generated between a gate electrode and a channel region or between a lower electrode and an upper electrode may decrease when the thin film is employed as the gate insulation layer or the dielectric layer. Further, a coupling ratio of the flash memory device may be enhanced when the thin film is used as the dielectric layer of the flash memory device.

Examples of materials having high dielectric constants may include tantalum oxide ($Ta_2O_5$), yttrium oxide ($Y_2O_3$), hafnium oxide ($HfO_2$), zirconium oxide ($ZrO_2$), niobium oxide ($Nb_2O_5$), barium titanium oxide ($BaTiO_3$), strontium titanium oxide ($SrTiO_3$), etc. When a thin film includes hafnium oxide, the thin film may be formed using a hafnium precursor and an oxidizing agent.

Examples of a hafnium precursor for forming a thin film of hafnium oxide may include tetrakis(ethylmethylamino) hafnium (TEMAH) represented by $Hf(NC_2H_5CH_3)_4$ or hafnium tetra-tert-butoxide (HTTB) represented by $Hf(OC_4H_9)_4$. When a thin film including hafnium oxide is formed using TEMAH, the thin film may have good dielectric characteristic. However, TEMAH has a relatively low saturation vapor pressure. For example, when TEMAH is heated at a temperature of about 90° C. in a canister to be vaporized, TEMAH has a saturation vapor pressure of about 1 Torr. Because of the low saturation vapor pressure, process time for providing the hafnium precursor into a chamber increases. An increase in process time may cause a throughput reduction of a semiconductor manufacturing process. In addition, when TEMAH is heated to a temperature higher than about 90° C., in order to enhance the saturation vapor pressure, TEMAH may be denatured.

HTTB has a relatively high saturation vapor pressure. For example, HTTB has a saturation vapor pressure greater than or equal to about 5 Torr at a temperature of about 90° C. However, HTTB may rapidly vaporize at an elevated temperature, so that HTTB does not react with the oxidizing agent and hafnium oxide is not formed.

SUMMARY OF THE INVENTION

Example embodiments of the present invention provide a method of forming a thin film including hafnium oxide that has improved electrical characteristics by enhancing a throughput of a semiconductor manufacturing process.

Example embodiments of the present invention provide a method of forming a thin film including hafnium oxide using a hafnium precursor that has a relatively high saturation vapor pressure and sufficient reactivity with an oxidizing agent.

Example embodiments of the present invention provide a method of manufacturing a gate structure having a gate insulation layer including hafnium oxide.

Example embodiments of the present invention provide a method of manufacturing a capacitor having a dielectric layer including hafnium oxide.

According to an example embodiment of the present invention, there is provided a method of forming a thin film. In the method of forming the thin film, a hafnium precursor including one alkoxy group and three amino groups, and an oxidizing agent are provided on a substrate, and the hafnium precursor is reacted with the oxidizing agent to form the thin film including hafnium oxide on the substrate.

In an example embodiment of the present invention, the hafnium precursor may be represented by the following chemical formula.

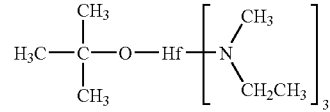

In an example embodiment of the present invention, the hafnium precursor may be provided by preparing the hafnium precursor in a liquid phase, heating the hafnium precursor in the liquid phase at a temperature of about 65° C. to about 75° C. to form the hafnium precursor in a gas phase that has a saturation vapor pressure higher than or equal to about 1 Torr, and introducing the hafnium precursor in the gas phase on the substrate.

In an example embodiment of the present invention, the hafnium precursor may be provided by preparing the hafnium precursor in a liquid phase, heating the hafnium precursor in the liquid phase at a temperature of about 85° C. to about 95° C. to form the hafnium precursor in a gas phase that has a saturation vapor pressure higher than or equal to about 3 Torr, and introducing the hafnium precursor in the gas phase on the substrate.

In an example embodiment of the present invention, the oxidizing agent may include ozone ($O_3$), oxygen ($O_2$), water vapor ($H_2O$), oxygen ($O_2$) plasma or remote oxygen ($O_2$) plasma, which may be used alone or in combination.

In an example embodiment of the present invention, the thin film including hafnium oxide may include a gate insulation layer.

In an example embodiment of the present invention, the thin film including hafnium oxide may include a dielectric layer.

In an example embodiment of the present invention, the thin film may be formed by an atomic layer deposition process or a chemical vapor deposition process.

According to another example embodiment of the present invention, there is provided a method of manufacturing a gate structure. In the method of manufacturing the gate structure, a hafnium precursor including one alkoxy group and three amino groups, and an oxidizing agent are provided on a substrate, and then the hafnium precursor is reacted with the oxidizing agent to form a gate insulation layer including hafnium oxide on the substrate. After a gate conductive layer is formed on the gate insulation layer, the gate conductive layer and the gate insulation layer are successively patterned to form a gate pattern including a gate conductive layer pattern and a gate insulation layer pattern including hafnium oxide on the substrate.

According to another example embodiment of the present invention, there is provided a method of manufacturing a capacitor. In the method of manufacturing the capacitor, a lower electrode is formed on a substrate. After a hafnium precursor including one alkoxy group and three amino groups, and an oxidizing agent are provided on the lower electrode, the hafnium precursor is reacted with the oxidizing agent to form a dielectric layer including hafnium oxide on the lower electrode. Subsequently, an upper electrode is formed on the dielectric layer to form a capacitor including the lower electrode, the dielectric layer including hafnium oxide and the upper electrode.

According to example embodiments of the present invention, the hafnium precursor including tert-butoxy-tris(ethylmethylamino) hafnium (hereinafter, referred to as NOH-31) has a saturation vapor pressure and a reactivity with oxygen substantially higher than those of a conventional hafnium precursors, for example, tetrakis(ethylmethylamino) hafnium (TEMAH). Therefore, when a thin film is formed using the hafnium precursor including NOH-31, throughput of a semiconductor manufacturing process and/or step coverage characteristics of the thin film may be enhanced. Further, leakage current from the thin film may be reduced. As a result, a hafnium precursor including NOH-31 may be used for forming a gate insulation layer of the gate structure and a dielectric layer of the capacitor.

BRIEF DESCRIPTION OF THE DRAWINGS

The above and other features and advantages of example embodiments of the present invention provide will become more apparent by describing in detailed example embodiments thereof with reference to the accompanying drawings, in which.

DETAILED DESCRIPTION OF EXAMPLE EMBODIMENTS OF THE INVENTION

Figure 1:
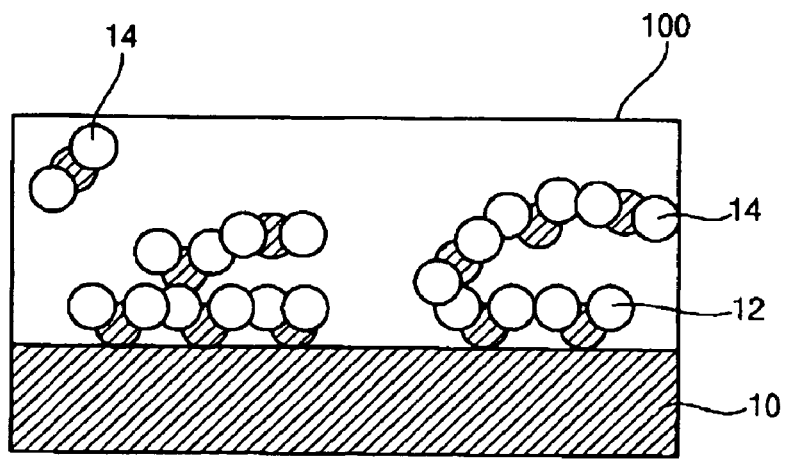
FIGS. 1 to 5 are cross-sectional views illustrating a method of forming a thin film in accordance with an example embodiment of the present invention.

The invention is described more fully hereinafter with reference to the accompanying drawings, in which example embodiments of the invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming a Thin Film

FIGS. 1 to 5 are cross-sectional views illustrating a method of forming a thin film in accordance with an example embodiment of the present invention.

FIG. 1 is a cross-sectional view illustrating chemically adsorbing a hafnium precursor on a substrate 10.

Referring to FIG. 1, the substrate 10 may be positioned in a chamber 100. The chamber 100 may have a temperature of about 250° C. to about 500° C. The temperature of the chamber 100 may also be in a range of about 250° C. to about 400° C., for example, in a range of about 300° C. to about 350° C. For example, the chamber 100 may have a temperature of about 300° C.

The chamber 100 may have the pressure of about 0.01 Torr to about 10 Torr. The pressure of the chamber 100 may be in a range of about 0.05 Torr to about 5 Torr, for example, in a range of about 0.1 Torr to about 3 Torr. For example, the chamber 100 may have a pressure of about 1.0 Torr.

After the substrate 10 is loaded in the chamber 100 having the above temperature and pressure, a hafnium precursor in the gas phase may be provided into the chamber 100. The hafnium precursor may be provided using a canister or a liquid delivery system (LDS). The hafnium precursor may be provided on the substrate 10 for about 0.5 seconds to about 5 seconds. For example, the hafnium precursor may be provided into the chamber 100 for about one second.

A first portion 12 of the hafnium precursor may be chemisorbed (e.g. chemically adsorbed) on the substrate 10, whereas a second portion 14 of the hafnium precursor may not be non-chemisorbed on the substrate 10. In other words, the second portion 14 of the hafnium precursor may be physisorbed (e.g. physically adsorbed) to be weakly bonded with the substrate 10, or may drift in the chamber 100.

In an example embodiment of the present invention, a portion of the chemisorbed first portion 12 of the hafnium precursor may be thermally decomposed by heat in the chamber 100. Thus, hafnium atoms in the hafnium precursor may be chemically adsorbed on the substrate 10, and portions of ligands in the hafnium precursor may be separated from the hafnium atoms.

The hafnium precursor may exist in a liquid phase at a room temperature, and exists in the gas phase at a temperature of higher than or equal to about 60° C. For example, after the hafnium precursor in the liquid phase is introduced into the canister, the hafnium precursor in the liquid phase may be heated at a temperature of about 60° C. to about 95° C. with an inactive gas bubble to thereby form the hafnium precursor in the gas phase. The hafnium precursor in the gas phase may be generated until the canister is saturated.

The hafnium precursor of example embodiments of the present invention may include a metal organic compound containing hafnium. For example, the hafnium precursor may include one alkoxy group and three amino groups. The alkoxy group and the amino group may include at least one alkyl group. For example, the hafnium precursor includes tert-butoxy-tris(ethylmethylamino) hafnium (NOH-31) represented by the following chemical formula (1).

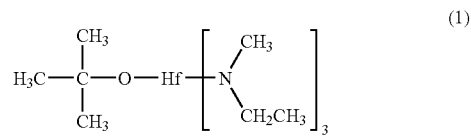

(1)

The hafnium precursor represented by the chemical formula (1) exists in the liquid phase at the room temperature. When the hafnium precursor in the liquid phase is heated at a temperature of about 60° C. to about 75° C., the hafnium precursor may have a saturation vapor pressure of higher than or equal to about 1 Torr in the canister. In addition, when the hafnium precursor in the liquid phase is heated at a temperature of about 85° C. to about 95° C., the hafnium precursor may have a saturation vapor pressure of higher than or equal to about 3 Torr in the canister. Thus, the hafnium precursor represented by the chemical formula (1) may have a saturation vapor pressure and a reactivity with an oxidizing agent higher than those of a conventional hafnium precursors, for example, tetrakis(ethylmethylamino) hafnium (TEMAH).

When the hafnium precursor has a higher saturation vapor pressure, a hafnium precursor in the gas phase may be easily generated and a process time for providing the hafnium precursor into the chamber 100 may be shortened. Further, an amount of an inactive gas introduced into the chamber 100 with the hafnium precursor may be reduced, and a flow rate (e.g., a volume) of the hafnium precursor may decrease.

Therefore, the thin film may have a higher dielectric constant and a leakage current from the thin film may be reduced when the thin film is formed using the above hafnium precursor. Additionally, a process time for forming the thin film may be reduced so that a throughput of a semiconductor manufacturing process may be improved.

Figure 2:
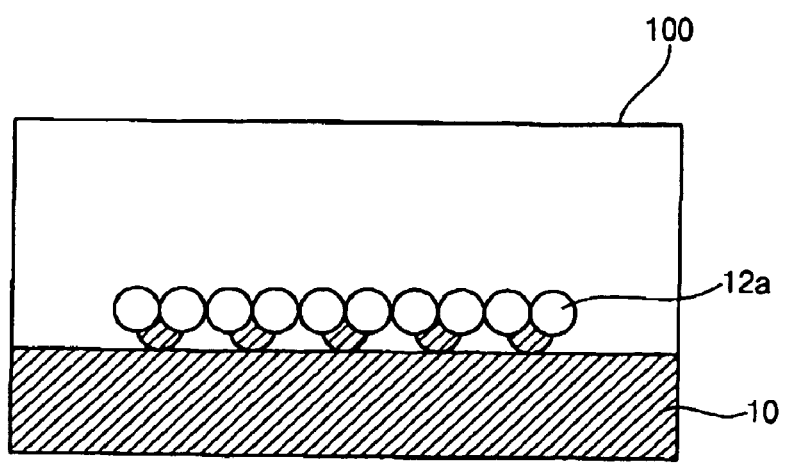

FIG. 2 is a cross-sectional view illustrating a step of forming an adsorption film 12a on the substrate 10.

Referring to FIG. 2, a first purge gas, for example, an inactive gas may be introduced into the chamber 100. Examples of the first purge gas may include an argon gas, a nitrogen gas, etc. The first purge gas may be provided for about 1 to about 30 seconds. For example, the first purge gas may be provided for about 30 seconds.

When the first purge gas is introduced into the chamber 100, the second portion 14 of the hafnium precursor physisorbed on the substrate 10 or drifting in the chamber 100 is removed from the chamber 100. As a result, the first portion 12 of the hafnium precursor remains on the substrate 10 to form the adsorption film 12a including hafnium precursor molecules on the substrate 10.

Alternatively, when the chamber 100 is maintained with a vacuum for about 1 to about 30 seconds without introducing the first purge gas, the second portion 14 of the hafnium precursor may be removed from the chamber 100.

Further, when the first purge gas is provided into the chamber 100 while vacuumizing the chamber 100, the second portion 14 of the hafnium precursor may be removed from the chamber 100.

Figure 3:
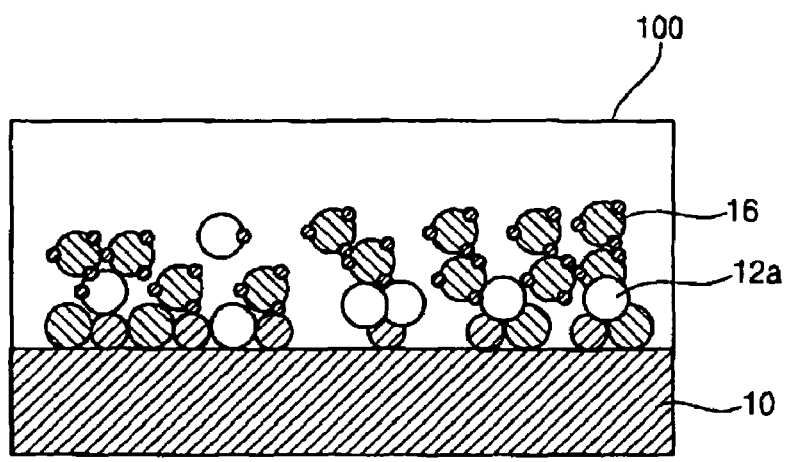

FIG. 3 is a cross-sectional view illustrating oxidizing the adsorption film 12a.

Referring to FIG. 3, the oxidizing agent 16 is provided into the chamber 100. Examples of the oxidizing agent 16 may include ozone ($O_3$), oxygen ($O_2$), water vapor ($H_2O$), oxygen ($O_2$) plasma, remote oxygen ($O_2$) plasma, etc. These can be used alone or in a combination thereof. The oxidizing agent 16 may be introduced for about 0.5 to about 5 seconds. For example, ozone ($O_3$) may be introduced into the chamber 100 as the oxidizing agent 16 for about two seconds.

When the oxidizing agent 16 is provided on the adsorption film 12a, the oxidizing agent 16 may chemically react with the hafnium precursor molecules in the adsorption film 12a to oxidize the hafnium precursor molecules.

Figure 4:
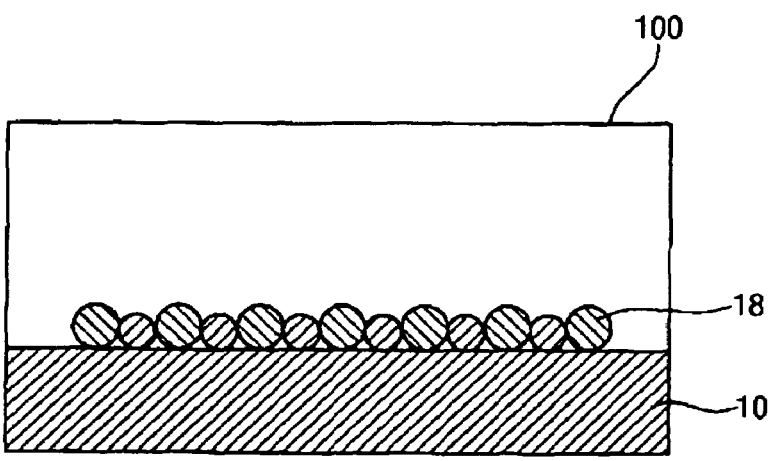

FIG. 4 is a cross-sectional view illustrating forming a preliminary thin film 18 on the substrate 10.

Referring to FIG. 4, a second purge gas may be introduced into the chamber 100. The second purge gas may be substantially the same as the first purge gas. Additionally, the second purge gas may be introduced into the chamber 100 for a time substantially to the same as that of the first purge gas described with reference to FIG. 2. The second purge gas may be provided into the chamber 100 to remove an unreacted portion of the oxidizing agent 16 from the chamber 100 and form the preliminary thin film 18, including hafnium oxide, on the substrate 10.

Figure 5:
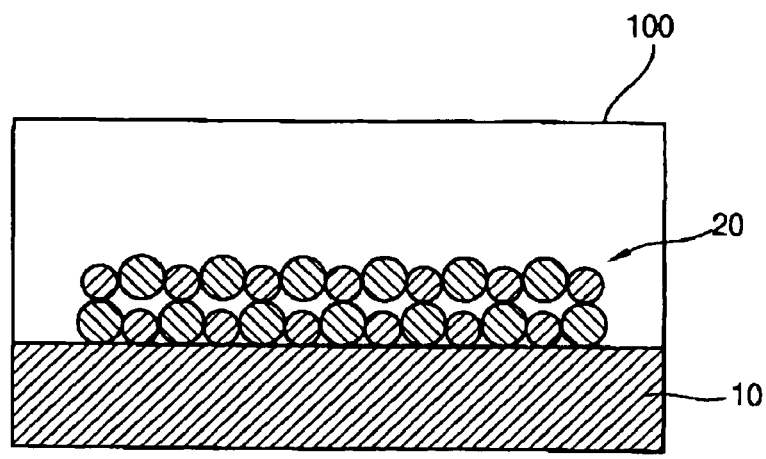

FIG. 5 is a cross-sectional view illustrating forming a thin film 20 on the substrate 10.

Referring to FIG. 5, providing the hafnium precursor, introducing the first purge gas, providing the oxidizing agent and introducing the second purge gas may be repeatedly performed at least once. As a result, a thin film 20 having a desired thickness is formed on the substrate 10. The thin film 20 may include hafnium oxide. The thickness of the thin film 20 may be adjusted by varying the number of cycles, each of which may include providing the hafnium precursor, introducing the first purge gas, providing the oxidizing agent and introducing the second purge gas.

In an example embodiment of the present invention, the thin film 20 may be formed using the hafnium precursor represented by the above chemical formula (1). As described above, the hafnium precursor represented by the chemical formula (1) may have a saturation vapor pressure substantially higher than that of a conventional precursor. Thus, when the thin film 20 is formed using the hafnium precursor represented by the chemical formula (1), the thin film 20 may have a higher dielectric constant and a leakage current from the thin film 20 may decrease.

In an example embodiment of the present invention, a thin film 20 may be formed by a chemical vapor deposition (CVD) process instead of the above-described atomic layer deposition (ALD) process. In the CVD process, the hafnium precursor in a gas phase and an oxidizing agent may be simultaneously introduced into the chamber 100. That is, a hafnium precursor in a gas phase and the oxidizing agent may be simultaneously provided on the substrate 10, and then the hafnium precursor may be chemically reacted with the oxidizing agent to thereby form the thin film 20 containing hafnium oxide on the substrate. For example, the hafnium oxide may be chemically adsorbed on the substrate. When the hafnium oxide may be continuously chemisorbed on the substrate for a desired time, the thin film 20 in a desired thickness may be obtained. The thickness of the thin film 20 may be adjusted by changing a process time of the CVD process.

Method of Manufacturing a Gate Structure

FIGS. 6 to 9 are cross-sectional views illustrating a method of manufacturing a gate structure in accordance with an example embodiment of the present invention.

Figure 6:
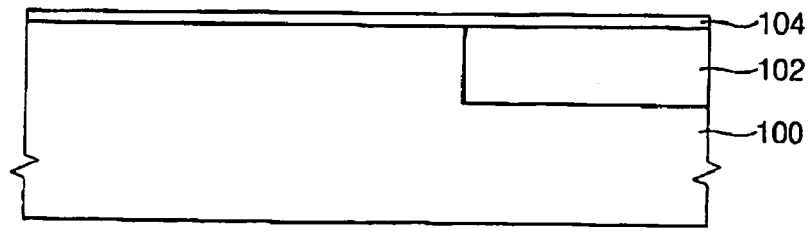
FIGS. 6 to 9 are cross-sectional views illustrating a method of manufacturing a gate structure in accordance with an example embodiment of the present invention.

FIG. 6 is a cross-sectional view illustrating forming a gate insulation layer 104 on a substrate 100.

Referring to FIG. 6, the substrate 100 is divided into an active region and a field region by forming an isolation layer 102 on the substrate 100 through an isolation process. The substrate 100 may include a silicon wafer or a silicon-on-insulator (SOI) substrate. The isolation layer 102 may be formed using an oxide, for example, silicon oxide by a shallow trench isolation (STI) process or a local oxidation of silicon (LOCOS) process.

The gate insulation layer 104 may be formed on the substrate 100. The gate insulation layer 104 may have a thin equivalent oxide thickness (EOT) and reduces a leakage current generated between a gate electrode 110a (see FIG. 8) and a channel region. The gate insulation layer 104 may be formed using a material having a higher dielectric constant, for example, a metal oxide. For example, the gate insulation layer 104 may be formed of hafnium oxide. When the gate insulation layer 104 includes hafnium oxide, the gate insulation layer 104 may be formed by the ALD process described with reference to FIGS. 1 to 5. Alternatively, the gate insulation layer 104 may be formed by the above-described CVD process in which the hafnium precursor and the oxidizing agent are simultaneously provided on the substrate 100. The gate insulation layer 104 may have a thickness of about 30 to about 100 Å.

In the ALD process or the CVD process for forming the gate insulation layer 104, the hafnium precursor may include one alkoxy group and three amino groups. For example, the hafnium precursor may include tert-butoxy-tris(ethylmethylamino) hafnium represented by the above chemical formula (1). When the hafnium precursor is heated at a temperature of about 73° C. in a canister, the hafnium precursor may have a saturation vapor pressure of higher than or equal to about 1 Torr, for example, in a range of about 1 Torr to about 2 Torr. In addition, when the hafnium precursor is heated at a temperature of about 90° C., the hafnium precursor may have a saturation vapor pressure higher than or equal to about 3 Torr, for example, in a range of about 3 Torr to about 5 Torr.

In an example embodiment of the present invention, the gate insulation layer 104 including hafnium oxide may be formed on the substrate 100 using the hafnium precursor represented by the chemical formula (1) through an ALD process. Alternatively, a silicon oxide layer (not shown) may be formed on the gate insulation layer 104. The silicon oxide layer may have a thickness of about 5 Å. The silicon oxide layer may be formed by an in-situ process after the gate insulation layer 104 is formed on the substrate 100.

Figure 7:
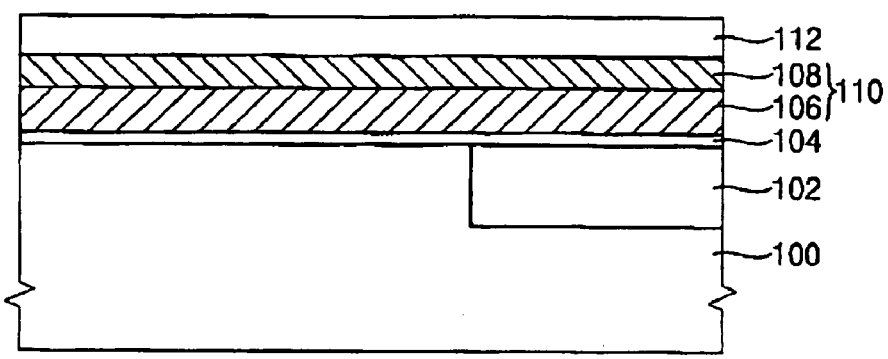

FIG. 7 is a cross-sectional view illustrating forming a gate conductive layer 110 on the gate insulation layer 104.

Referring to FIG. 7, the gate conductive layer 110 may be formed on the gate insulation layer 104. The gate conductive layer 110 may have a multi-layer structure in which a poly-silicon layer 106 and a metal silicide layer 108 (e.g. a tungsten silicide layer) are successively formed on the gate insulation layer 104. A capping insulation layer 112 may be formed on the gate conductive layer 110. The capping insulation layer 112 may be formed using an oxide, for example, silicon oxide.

Figure 8:
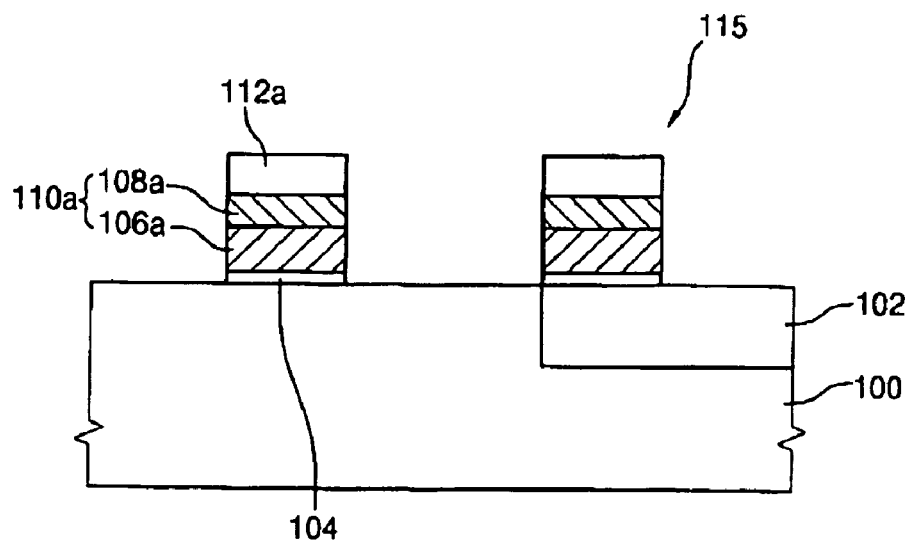

FIG. 8 is a cross-sectional view illustrating forming a gate structure 115 on the substrate 100.

Referring to FIG. 8, the capping insulation layer 112, the gate conductive layer 10 and the gate insulation layer 104 may be successively patterned to form the gate structure 115 on the substrate 100. The gate structure 115 may include a gate insulation layer pattern 104*a*, a gate conductive layer pattern 110*a* and/or a capping insulation layer pattern 112*a*. The capping insulation layer 112, the gate conductive layer 110 and/or the gate insulation layer 104 may be partially etched by a photolithography process.

Figure 9:
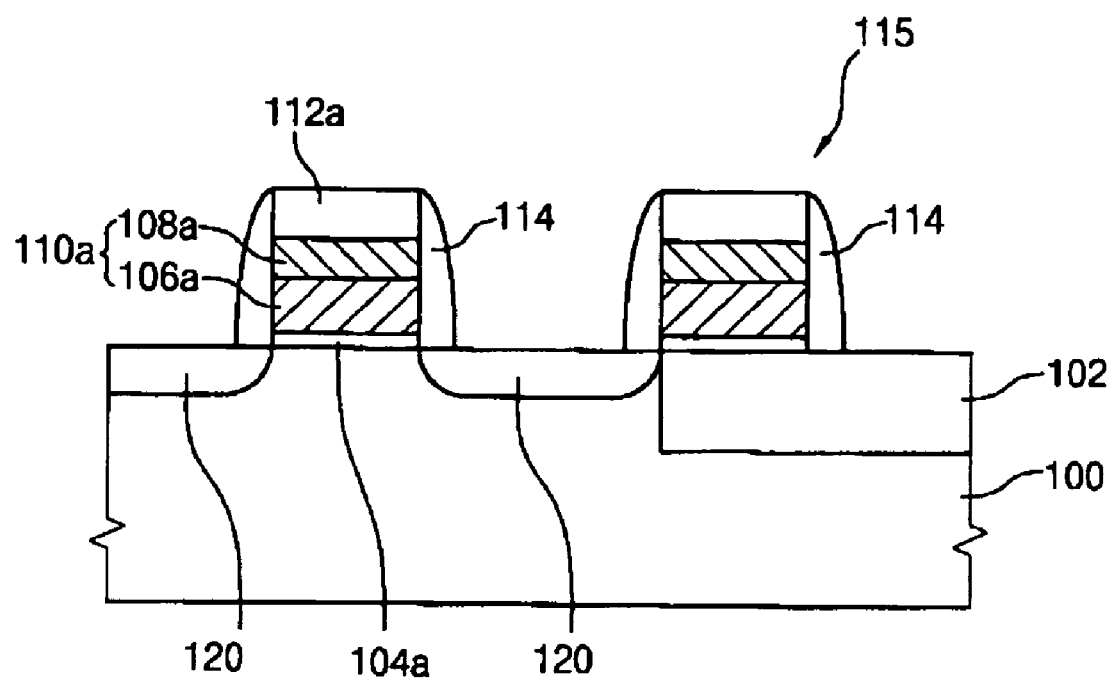

FIG. 9 is a cross-sectional view illustrating forming source/drain regions 120 at upper portions of the substrate 100.

Referring to FIG. 9, the source/drain regions 120 may be formed at the upper portions of the substrate 100 adjacent the gate structure 115 and a gate spacer 114 may be formed on a sidewall of the gate structure 115. Alternatively, the source/drain regions 120 may be formed at the upper portions of the substrate 100 after forming the gate spacer 114 on the sidewall of the gate structure 115.

As described above, because the gate insulation layer pattern 104*a* of the gate structure 115 includes hafnium oxide having a higher dielectric constant, the gate insulation layer pattern 104*a* may have a thin EOT and/or reduce the leakage current generated between the gate conductive layer pattern 110*a* and the substrate 100. In addition, when the gate insulation layer pattern 104*a* is formed using the hafnium precursor represented by the chemical formula (1), a process time for forming the gate insulation layer pattern 104*a* may be reduced. Thus, the gate structure 115 including the gate insulation layer pattern 104*a* may be more rapidly formed on the substrate 100.

Method of Manufacturing a Capacitor

FIGS. 10 to 13 are cross-sectional views illustrating a method of manufacturing a capacitor in accordance with an example embodiment of the present invention.

Figure 10:
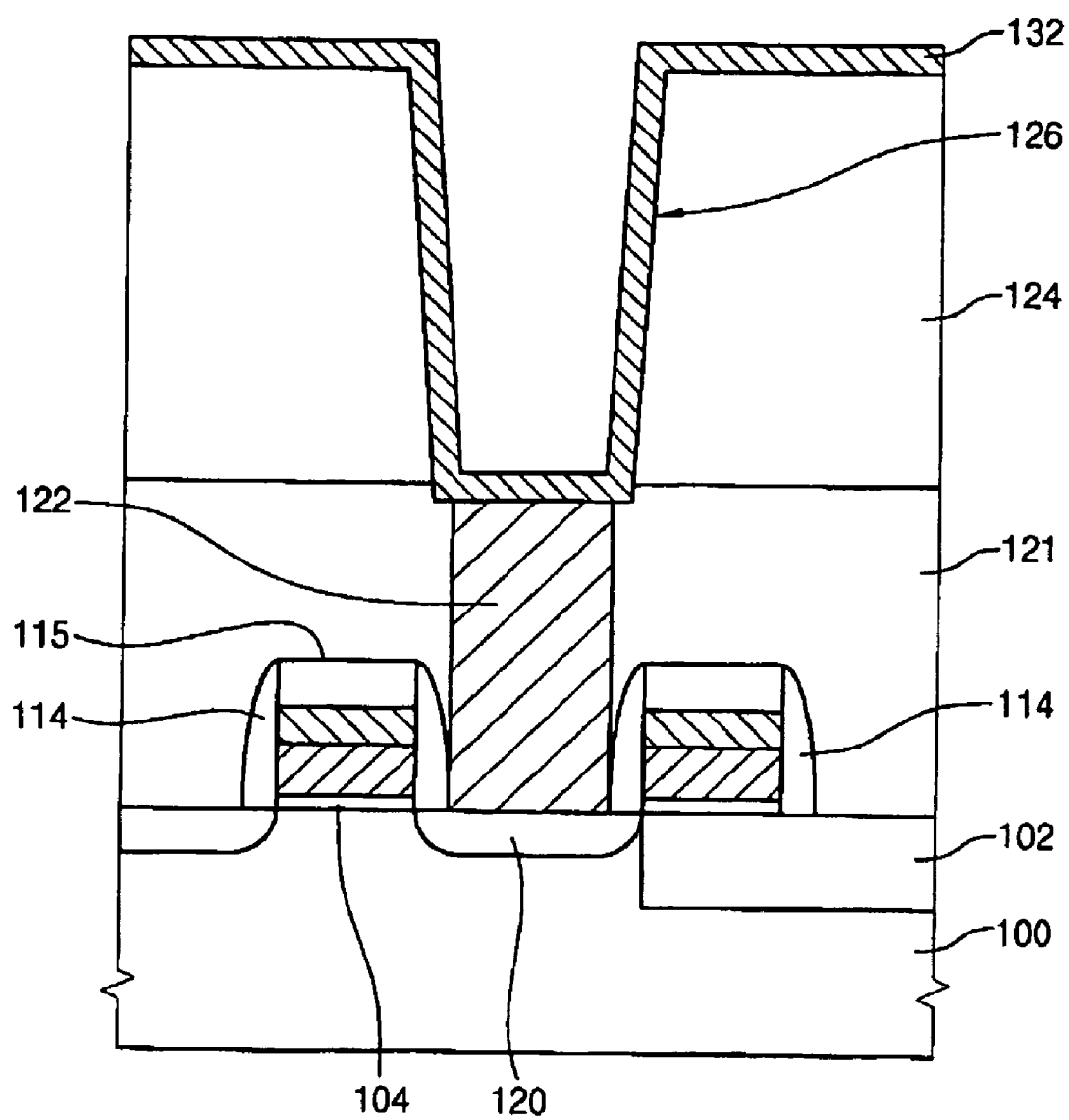
FIGS. 10 to 13 are cross-sectional views illustrating a method of manufacturing a capacitor in accordance with an example embodiment of the present invention.

FIG. 10 is a cross-sectional view illustrating forming a conductive layer 132 for forming a lower electrode 140 (see FIG. 11) over a substrate 100.

Referring to FIG. 10, a mold layer 124 may be formed over the substrate 100, and the mold layer 124 may be partially removed to form a contact hole 126 exposing a contact plug 122 buried in an insulating interlayer 121. The insulating interlayer 121 may cover gate structures 115 formed on the substrate 100. Each of the gate structures 115 may include a gate spacer 114 formed on a sidewall thereof. Source/drain regions 120 may be formed at upper portions of the substrate 100 adjacent to the gate strictures 115. The contact plug 122 may make contact with the source/drain regions 120 through the insulating interlayer 121. In an example embodiment of the present invention, conductive wiring, for example, a bit line, may be formed in the insulating interlayer 121.

The conductive layer 132 may be continuously formed on the mold 124, a sidewall of the contact hole 126 and/or the contact plug 122. The conductive layer 132 may be formed using a conductive material, for example, doped polysilicon, titanium nitride, tantalum nitride, tungsten nitride, ruthenium, etc. These can be used alone or in combination. The conductive layer 132 may be formed by a CVD process, an ALD process, a sputtering process, a pulsed layer deposition (PLD) process, etc.

Figure 11:
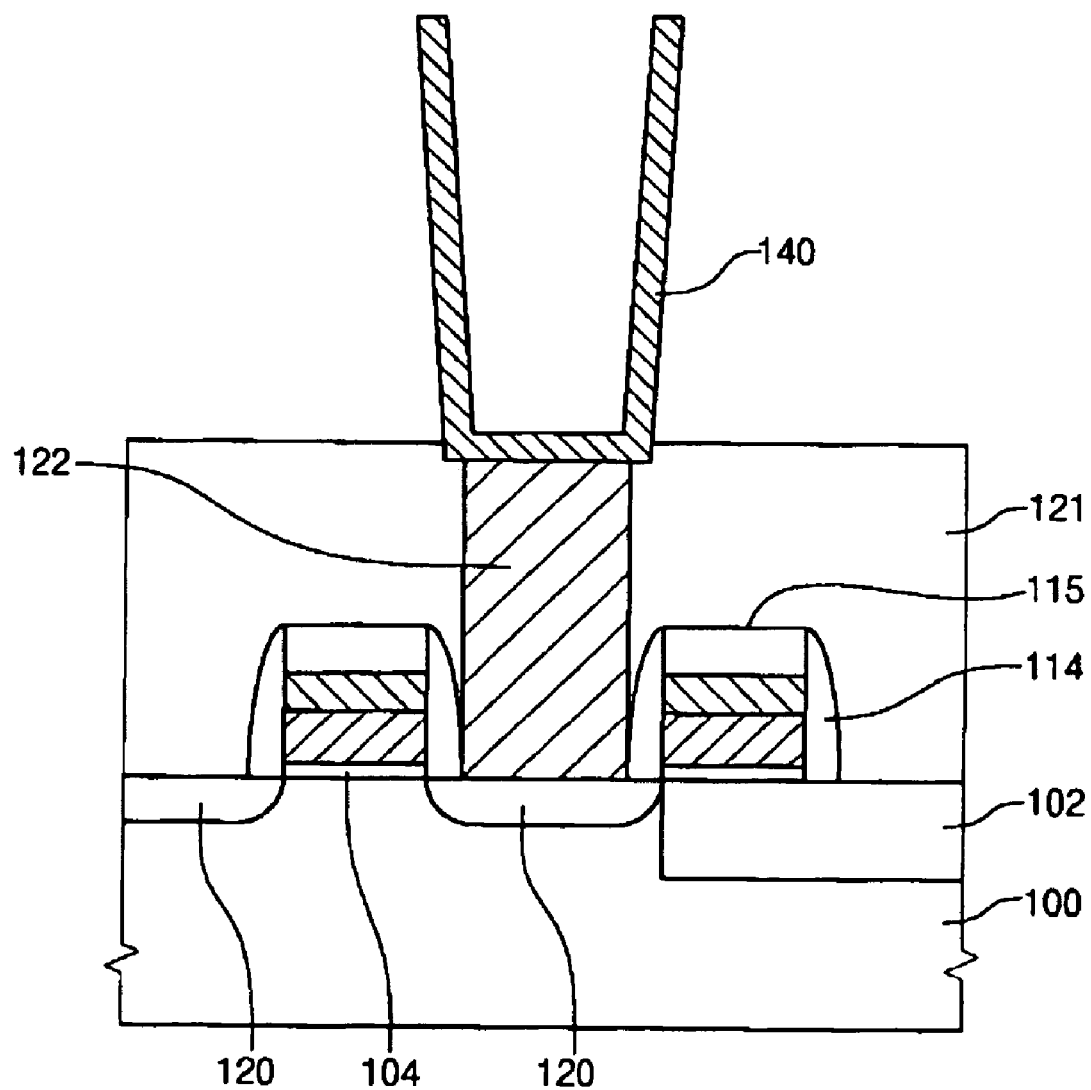

FIG. 11 is a cross-sectional view illustrating forming the lower electrode 140 on the contact plug 122.

Referring to FIG. 11, the lower electrode 140 is formed on the contact plug 122. In an example embodiment of the present invention, a sacrifice layer (not shown) is formed on the conductive layer 132 to fill the contact hole 126. The sacrifice layer may be partially removed until an upper face of the conductive layer 132 is exposed. The conductive layer 132 positioned on the mold layer 124 may be partially removed to form the lower electrode 140 on the sidewall of the contact hole 126 and the contact plug 122. The sacrifice layer and the mold layer 124 may be completely removed to form the lower electrode 140. The lower electrode 140 may have a cylindrical shape. The lower electrode 140 may include an upper portion having a width substantially wider than that of a lower portion of the lower electrode 140.

Figure 12:
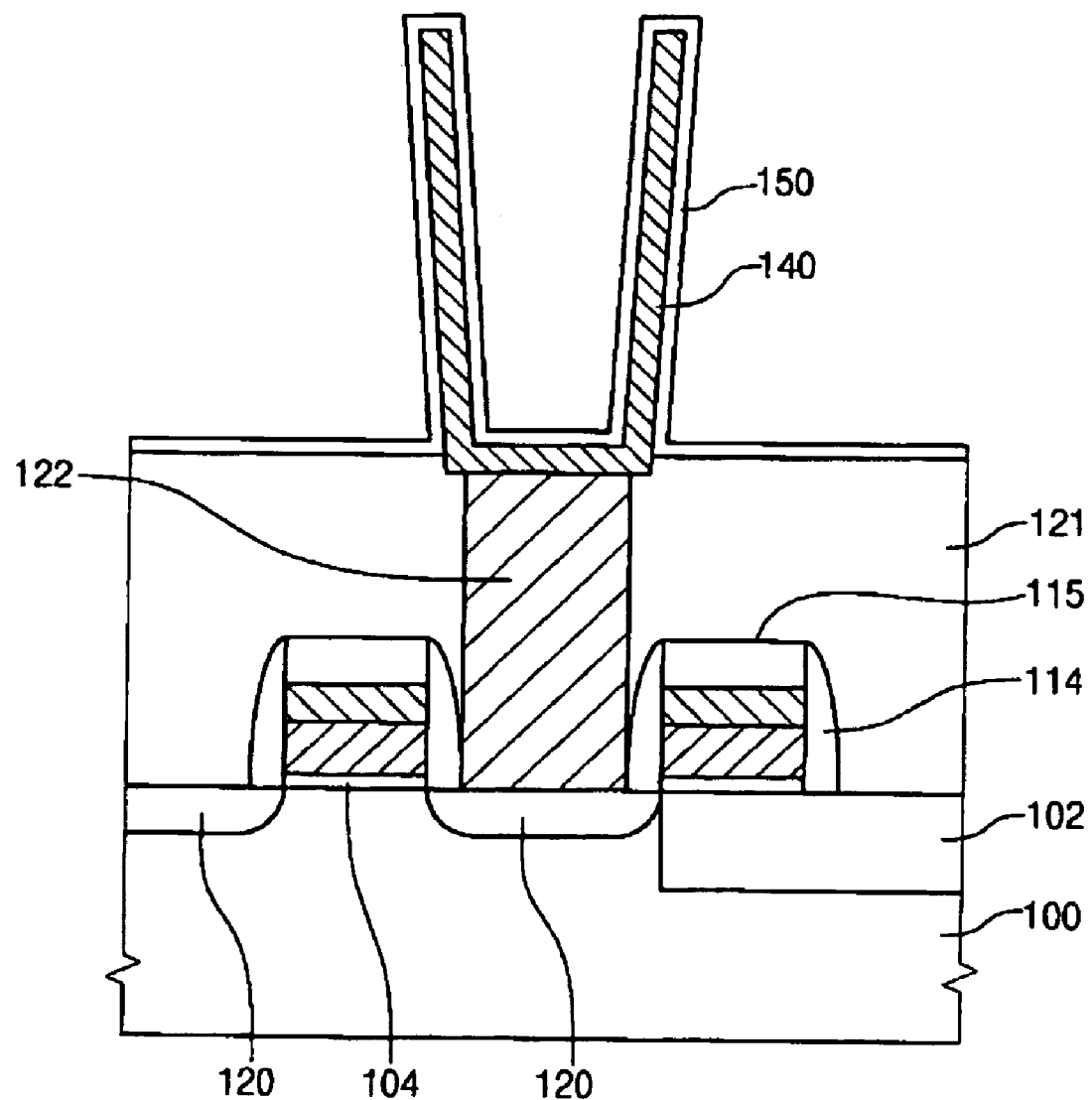

FIG. 12 is a cross-sectional view illustrating forming a dielectric layer 150 on the lower electrode 140 and the insulating interlayer 121.

Referring to FIG. 12, the dielectric layer 150 may be formed on the insulating interlayer 121 and the lower electrode 140. The dielectric layer 150 may be formed using a material that has a higher dielectric constant and/or a thinner EOT. The dielectric layer 150 may reduce or prevent a leakage current generated between the lower electrode 140 and an upper electrode 160 (see FIG. 13). In an example embodiment of the present invention, the dielectric layer 150 may include hafnium oxide by a process substantially the same as the process described with reference to FIGS. 1 to 5. The dielectric layer 150 may have a thickness of about 30 Å to about 100 Å.

In an example embodiment of the present invention, the dielectric layer 150 may be formed sequentially using a hafnium precursor and an oxidizing agent by an ALD process. Alternatively, the dielectric layer may be formed simultaneously using a hafnium precursor and an oxidizing agent by a CVD process.

In the ALD process or the CVD process for forming the dielectric layer 150, the hafnium precursor may include one alkoxy group and three amino groups. For example, the hafnium precursor includes tert-butoxy-tris(ethylmethylamino) hafnium represented by the above chemical formula (1). When the hafnium precursor is heated at a temperature of about 73° C. in a canister, the hafnium precursor may have a saturation vapor pressure of greater than or equal to about 1 Torr. In addition, when the hafnium precursor is heated to a temperature of about 90° C., the hafnium precursor may have a saturation vapor pressure of greater than or equal to about 3 Torr.

In an example embodiment of the present invention, the dielectric layer 150 including hafnium oxide may be formed on the lower electrode 140 using the hafnium precursor represent by the chemical formula (1) by the ALD process.

Figure 13:
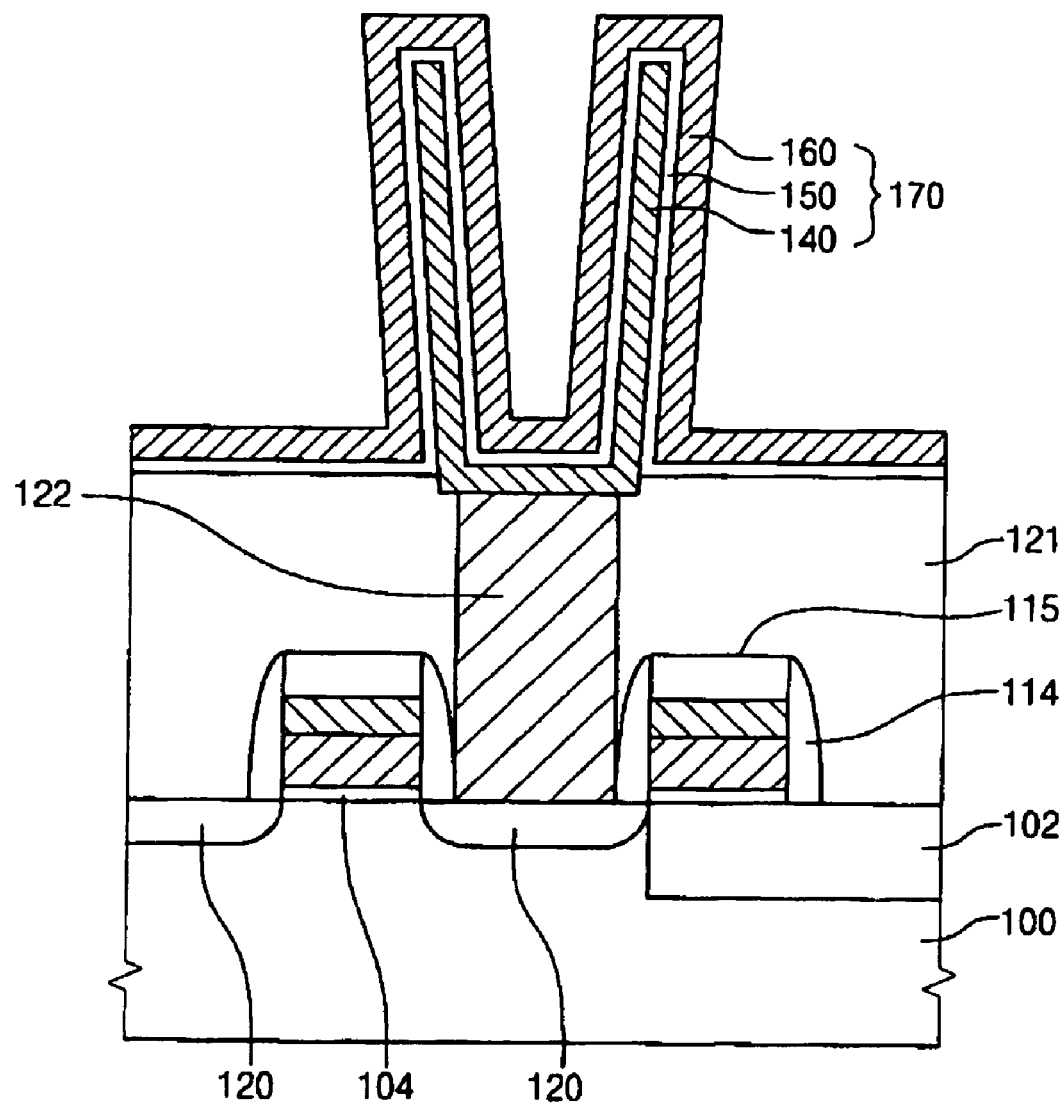

FIG. 13 is a cross-sectional view illustrating forming the upper electrode 160 on the dielectric layer 150.

Referring to FIG. 13, the dielectric layer 150 may be thermally treated to remove impurities from the dielectric layer 150 and to cure oxygen defects generated in the dielectric layer 150. The dielectric layer 150 may be thermally treated by an ultraviolet ray-ozone (UV-$O_3$) treatment process or a plasma treatment process.

The upper electrode 160 may be formed on the dielectric layer 150. The upper electrode 160 may be formed using a conductive material, for example, doped polysilicon, titanium nitride, tantalum nitride, tungsten nitride, ruthenium, etc. These can be used alone or in combination. As a result, a capacitor 170 including the lower electrode 140, the dielectric layer 150 and/or the upper electrode 160 may be formed over the substrate 100.

In an example embodiment of the present invention, the dielectric layer 150 may include hafnium oxide having a higher dielectric constant. Therefore, the dielectric layer 150 may have a thin EOT and/or may reduce or prevent leakage current.

Evaluation of Saturation Vapor Pressures of Hafnium Precursors

Figure 14:
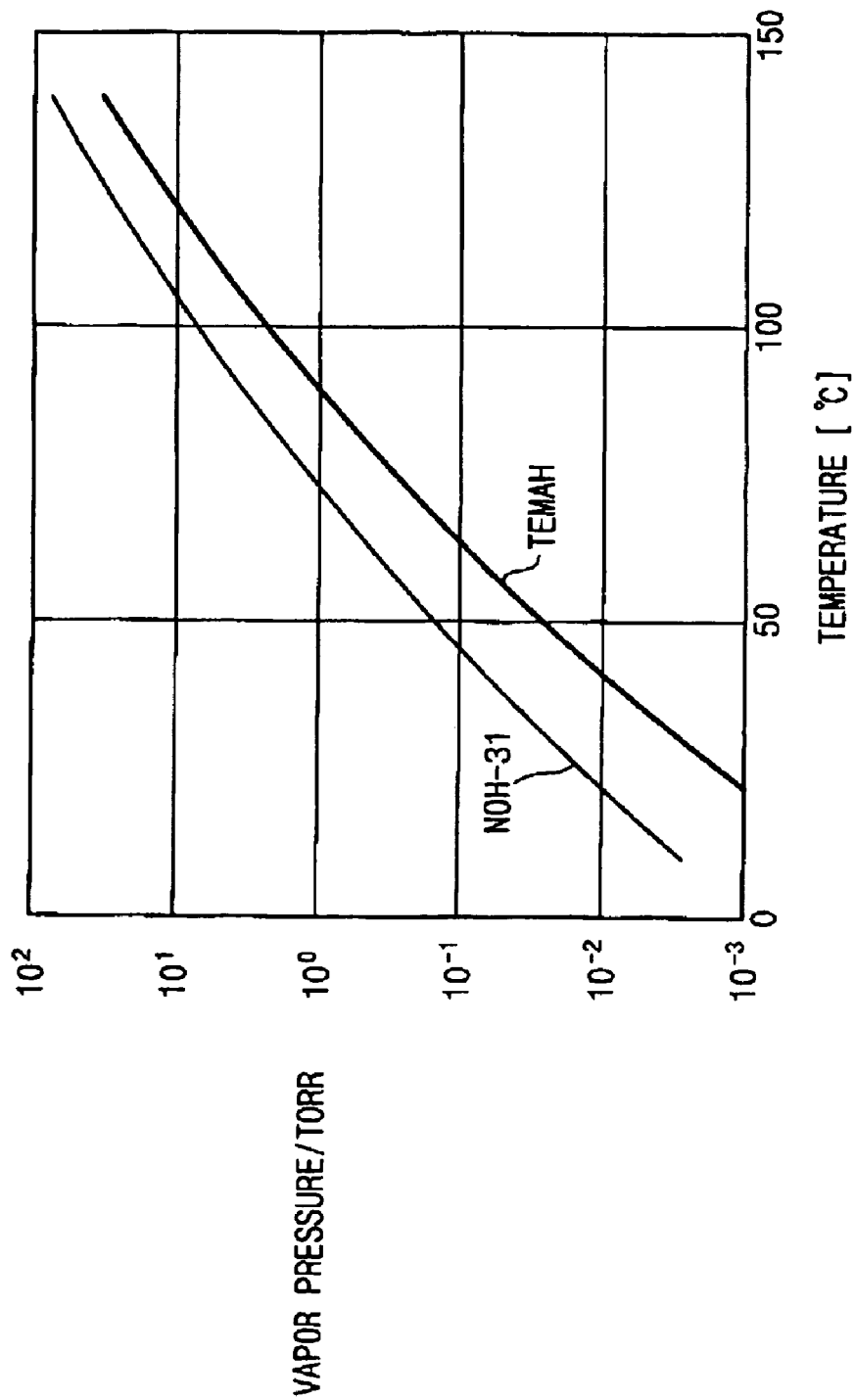
FIG. 14 is a graph showing variations of saturation vapor pressures of hafnium precursors relative to temperatures in accordance with an example embodiment of the present invention.

FIG. 14 is a graph showing saturation vapor pressures of hafnium precursors relative to temperature in accordance with an example embodiment of the present invention.

Saturation vapor pressures of hafnium precursors for forming thin films including hafnium oxide were estimated using a first hafnium precursor including tert-butoxy-tris(ethylmethylamino) hafnium (NOH-31) and a second hafnium precursor including tetrakis(ethylmethylamino) hafnium (TEMAH). The first and second hafnium precursors were stored in canisters having substantially the same volumes. For example, each of the canisters had a volume of about 10 L. After the first and second hafnium precursors were heated to vaporize the hafnium precursors, the saturation vapor pressures of the first and second hafnium precursors in vapor phases were measured according to temperature. As shown in FIG. 14, internal pressure variations of the canisters were measured with respect to temperatures of about 20° C. to about 90° C., respectively, because the saturation vapor pressures of the first and second hafnium precursors were substantially the same as internal pressures of the canisters.

Referring to FIG. 14, when the first hafnium precursor was heated to a temperature of about 72° C. in the canister, the canister had an internal pressure of about 1 Torr. In addition, when the first hafnium precursor was heated to a temperature of about 90° C. in the canister, the canister had an internal pressure of about 3 Torr. However, when the second hafnium precursor was heated to temperatures of about 72° C. and about 90° C. in the canister; respectively, the internal pressures of the canister were about 0.4 Torr and about 1 Torr, respectively. As a result, the first hafnium precursor had a saturation vapor pressure about three times higher than that of the second hafnium precursor. Therefore, when a thin film is formed using the first hafnium precursor, a process time for forming the thin film may be reduced so that a throughput of a semiconductor manufacturing process may be enhanced.

Evaluation of Vaporizations of Hafnium Precursors

Figure 15:
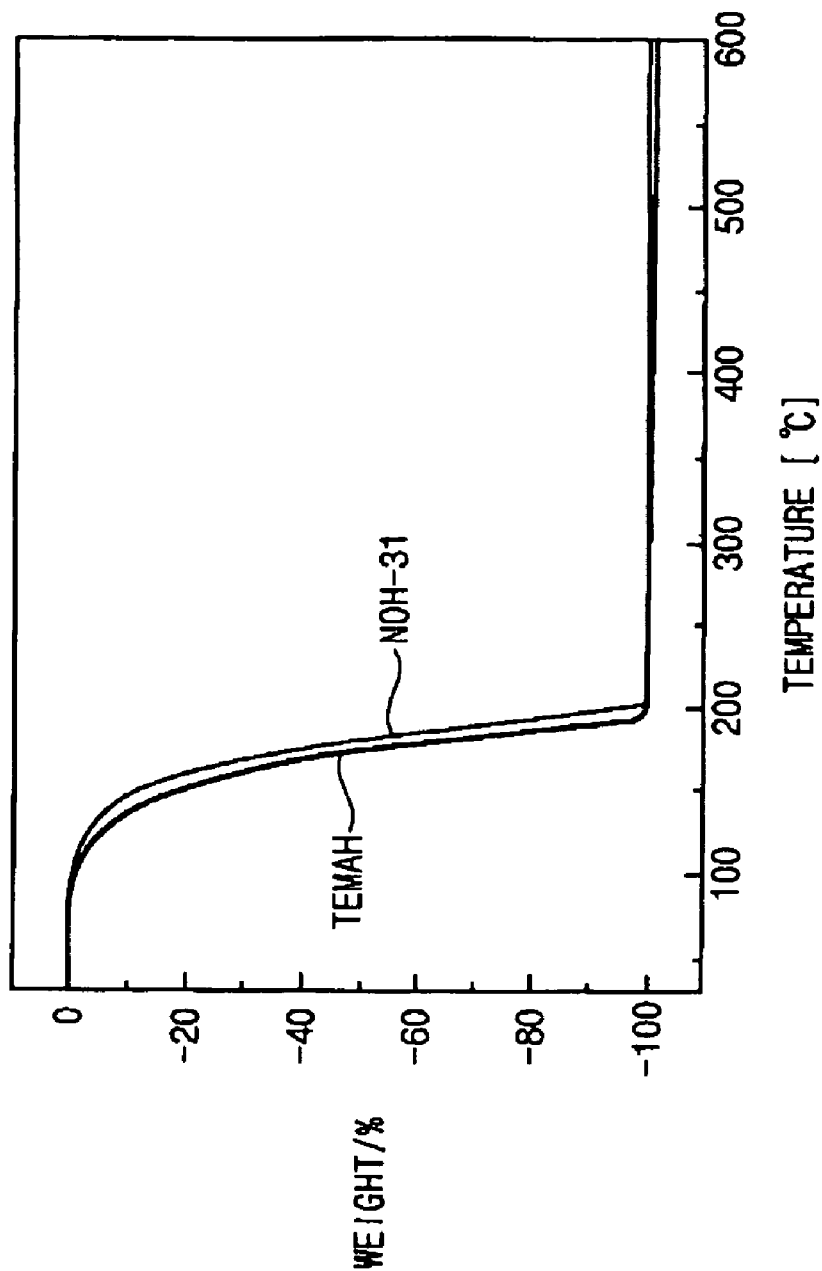
FIG. 15 is a graph showing example thermal gravimetric analysis (TGA) results of hafnium precursors.

FIG. 15 is a graph showing thermal gravimetric analysis (TGA) results of hafnium precursors.

The thermal gravimetric analysis was carried out using the first hafnium precursor including NOH-31 and the second hafnium precursor including TEMAH. In the thermal gravimetric analysis, a weight variation of a sample was measured relative to a temperature and/or a time while the sample was heated at a constant rate or maintained at a desired temperature. The weight variation of the sample due to thermal decomposition, sublimation, vaporization or oxidation was analyzed from a thermogram.

Referring to FIG. 15, while each of the first and second hafnium precursors was heated at the rate of about 5° C./min from a room temperature to about 400° C., weight decreases of the first and second hafnium precursors were measured. As a result, weights of the first and second hafnium precursors were rapidly reduced at temperatures between about 100° C. and about 200° C. The weight decreases of the first and second hafnium precursors were analyzed due to vaporization of the first and second hafnium precursors. Therefore, the first hafnium precursor was fit to be used for forming a thin film using an ALD or a CVD process, like the second hafnium precursor conventionally used for the ALD or the CVD process.

Evaluation of Reactivities of Hafnium Precursors with Oxygen

Figure 16:
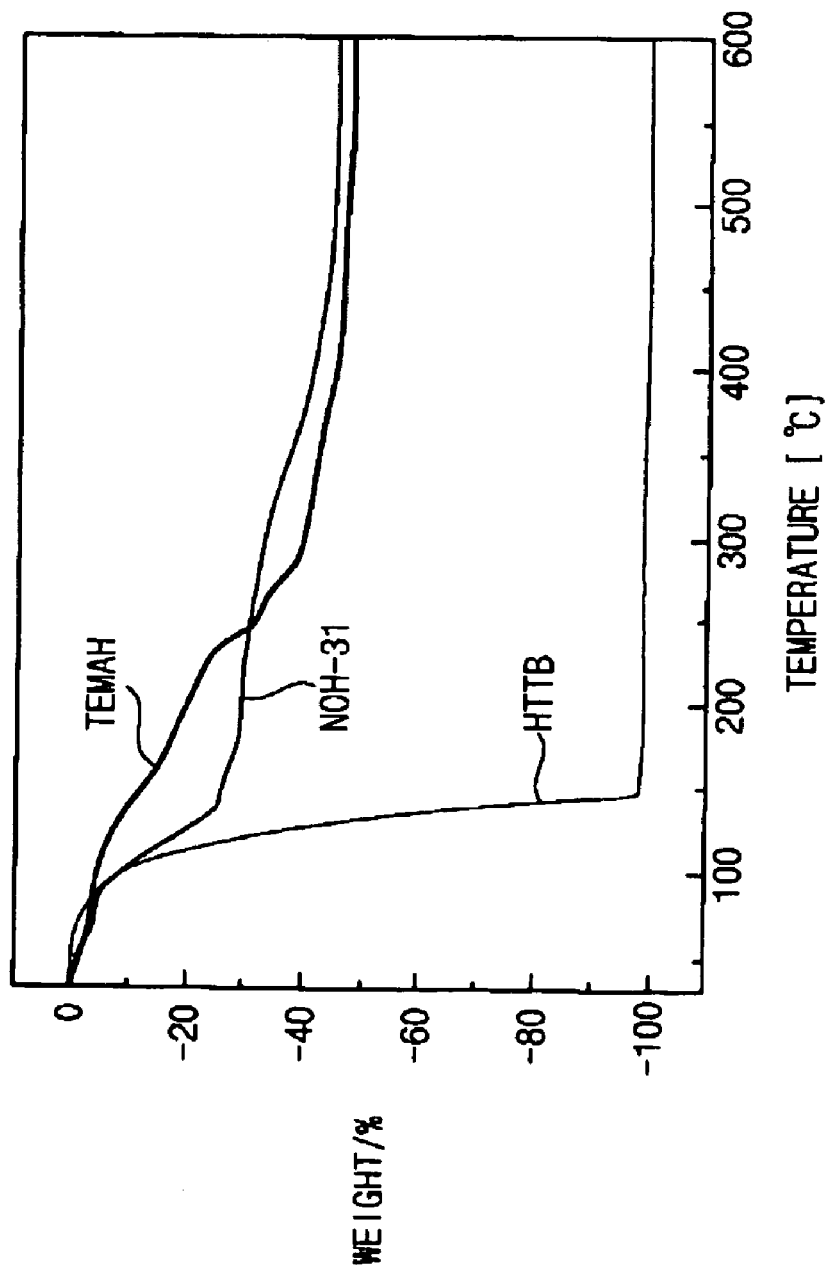
FIG. 16 is a graph showing example reactivities of hafnium precursors with oxygen.

FIG. 16 is a graph showing reactivities of hafnium precursors with oxygen.

Referring to FIG. 16, reactivities of hafnium precursors with oxygen were estimated using the first hafnium precursor including NOH-31, the second hafnium precursor including TEMAH and a third hafnium precursor including hafnium tetra-tert-butoxide (HTTB). While each of the hafnium precursors was heated at the rate of about 5° C./min from room temperature to about 400° C. with the introduction of oxygen gas, reactivities of the hafnium precursors with oxygen were measured from weight decreases of the hafnium precursors. As a result, the first hafnium precursor had the highest reactivity with oxygen in a temperature range of about 100° C. to about 250° C., compared with those of the second and third hafnium precursors. The third hafnium precursor was vaporized at a temperature of about 140° C. and was not reacted with oxygen. Therefore, the first hafnium precursor had reactivity with oxygen substantially higher than that of the second hafnium precursor, so that the first hafnium precursor was more appropriate for forming a thin film through an ALD or CVD process. Further, when the thin film was formed using the first hafnium precursor, a process time for forming the thin film was reduced.

According to example embodiments of the present invention, a hafnium precursor including tert-butoxy-tris(ethylmethylamino) hafnium (NOH-31) has a saturation vapor pressure and a reactivity with oxygen substantially higher than those of conventional hafnium precursors, for example, tetrakis(ethylmethylamino) hafnium (TEMAH). Therefore, when a thin film is formed using a hafnium precursor including NOH-31, the thin film including hafnium oxide may be formed more rapidly, so that a throughput of a semiconductor manufacturing process may be enhanced. In addition, when the thin film is formed using a hafnium precursor including NOH-31, the thin film may have an enhanced step coverage characteristic. Furthermore, leakage current from the thin film may be reduced. A hafnium precursor including NOH-31 may be used for forming a gale insulation layer of a gate structure or a dielectric layer of a capacitor and thus reliability of a semiconductor device may be improved.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a thin film comprising:
providing a hafnium precursor including one alkoxy group and three amino groups, and an oxidizing agent on a substrate; and reacting the hafnium precursor with the oxidizing agent to form the thin film including hafnium oxide on the substrate.

2. The method of claim 1, wherein the hafnium precursor is represented by chemical formula (1)

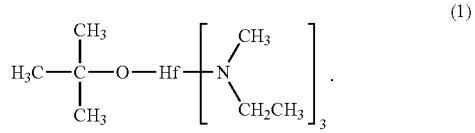
(1)

3. The method of claim 1, wherein providing the hafnium precursor includes:
preparing the hafnium precursor in a liquid phase;
heating the hafnium precursor in the liquid phase at a temperature of about 65° C. to about 75° C. to form the hafnium precursor in a gas phase that has a saturation vapor pressure higher than or equal to about 1 Torr; and
introducing the hafnium precursor in the gas phase on the substrate.

4. The method of claim 1, wherein providing the hafnium precursor includes:
preparing the hafnium precursor in a liquid phase;
heating the hafnium precursor in the liquid phase at a temperature of about 85° C. to about 95° C. to form the hafnium precursor in a gas phase that has a saturation vapor pressure higher than or equal to about 3 Torr; and
introducing the hafnium precursor in the gas phase on the substrate.

5. The method of claim 1, wherein the oxidizing agent includes at least one selected from the group consisting of ozone ($O_3$), oxygen ($O_2$), water vapor($H_2O$), oxygen ($O_2$) plasma and remote oxygen ($O_2$) plasma.

6. The method of claim 1, wherein the thin film including hafnium oxide includes a gate insulation layer.

7. The method of claim 1, wherein the thin film including hafnium oxide comprises a dielectric layer.

8. The method of claim 1, wherein the thin film is formed by an atomic layer deposition process or a chemical vapor deposition process.

9. A method of manufacturing a gate structure comprising:
providing a hafnium precursor including one alkoxy group and three amino groups, and an oxidizing agent on a substrate;
reacting the hafnium precursor with the oxidizing agent to form a gate insulation layer including hafnium oxide on the substrate;
forming a gate conductive layer on the gate insulation layer; and
successively patterning the gate conductive layer and the gate insulation to form a gate pattern including a gate conductive layer pattern and a gate insulation layer pattern on the substrate.

10. The method of claim 9, wherein the hafnium precursor is represented by chemical formula (1)

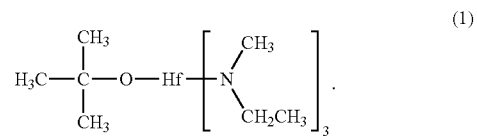
(1)

11. The method of claim 9, wherein providing the hafnium precursor includes:
preparing the hafnium precursor in a liquid phase;
heating the hafnium precursor in the liquid phase at a temperature of about 85° C. to about 95° C. to form the hafnium precursor in a gas phase that has a saturation vapor pressure higher than or equal to about 3 Torr; and
introducing the hafnium precursor in the gas phase on the substrate.

12. The method of claim 9, wherein the gate insulation layer is formed by an atomic layer deposition process or a chemical vapor deposition process.

13. The method of claim 9, wherein the gate insulation layer is formed at a temperature of about 250° C. to about 500° C. under a pressure of about 0.01 Torr to about 10 Torr.

14. A method of manufacturing a capacitor comprising:
forming a lower electrode on a substrate;
providing a hafnium precursor including one alkoxy group and three amino groups, and an oxidizing agent on the lower electrode;
reacting the hafnium precursor with the oxidizing agent to form a dielectric layer including hafnium oxide on the lower electrode; and
forming an upper electrode on the dielectric layer.

15. The method of claim 14, wherein the hafnium precursor is represented by chemical formula (1)

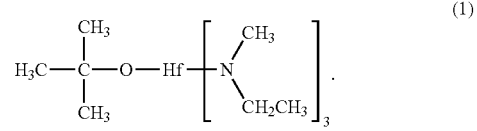
(1)

16. The method of claim 14, wherein providing the hafnium precursor includes:
preparing the hafnium precursor in a liquid phase;
heating the hafnium precursor in the liquid phase at a temperature of about 65° C. to about 75° C. to form the hafnium precursor in a gas phase that has a saturation vapor pressure higher than or equal to about 1 Torr; and
introducing the hafnium precursor in the gas phase on the lower electrode.

17. The method of claim 14, wherein the dielectric layer is formed by an atomic layer deposition process or a chemical vapor deposition process.

* * * * *